United States Patent
Miyamoto

(10) Patent No.: US 9,190,524 B2
(45) Date of Patent: Nov. 17, 2015

(54) THIN FILM TRANSISTOR SUBSTRATE, METHOD FOR PRODUCING THE SAME, AND DISPLAY DEVICE

(75) Inventor: Tadayoshi Miyamoto, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 331 days.

(21) Appl. No.: 13/821,304

(22) PCT Filed: Sep. 2, 2011

(86) PCT No.: PCT/JP2011/004926
§ 371 (c)(1),
(2), (4) Date: Mar. 7, 2013

(87) PCT Pub. No.: WO2012/032749
PCT Pub. Date: Mar. 15, 2012

(65) Prior Publication Data
US 2013/0188110 A1    Jul. 25, 2013

(30) Foreign Application Priority Data
Sep. 9, 2010    (JP) .................................. 2010-202382

(51) Int. Cl.
*G02F 1/136* (2006.01)
*H01L 29/786* (2006.01)
*H01L 27/12* (2006.01)
*H01L 29/66* (2006.01)

(52) U.S. Cl.
CPC ............ *H01L 29/7869* (2013.01); *G02F 1/136* (2013.01); *H01L 27/1225* (2013.01); *H01L 27/1251* (2013.01); *H01L 29/66742* (2013.01); *H01L 29/78645* (2013.01); *H01L 29/78648* (2013.01)

(58) Field of Classification Search
CPC ........................................................ G02F 1/136
See application file for complete search history.

(56) References Cited

U.S. PATENT DOCUMENTS

| 7,973,896 B2* | 7/2011 | Lee et al. ........................ 349/138 |
| 8,400,576 B2* | 3/2013 | Burns et al. ..................... 349/43 |
| 2003/0010922 A1 | 1/2003 | Yoon et al. |

(Continued)

FOREIGN PATENT DOCUMENTS

| CN | 101630685 A | 1/2010 |
| JP | 2009-004733 A | 1/2009 |

(Continued)

OTHER PUBLICATIONS

Official Communication issued in International Patent Application No. PCT/JP2011/004926, mailed on Nov. 8, 2011.

*Primary Examiner* — Timothy L Rude
(74) *Attorney, Agent, or Firm* — Keating & Bennett, LLP

(57) ABSTRACT

An active matrix substrate (20a) includes: an insulating substrate (10a); a first thin film transistor (5a) including a first gate electrode (11b) located on the insulating substrate (10a) and a first oxide semiconductor layer (13a) having a first channel region (Ca); a second oxide semiconductor layer (13b) including a second gate electrode (11c) located on the insulating substrate (10a) and having a second channel region (Cb); a second gate insulating film (17) covering the first oxide semiconductor layer (13a) and the second semiconductor layer (13b); and a third gate electrode (25) located on the second gate insulating film (17) and facing the first channel region (Ca) and the second channel region (Cb) with the second gate insulating film (17) interposed therebetween.

14 Claims, 15 Drawing Sheets

(56) References Cited

U.S. PATENT DOCUMENTS

| | | |
|---|---|---|
| 2008/0198285 A1* | 8/2008 | Hsieh et al. .................... 349/39 |
| 2010/0006835 A1 | 1/2010 | Yoon et al. |
| 2010/0012939 A1 | 1/2010 | Ishii |
| 2010/0012940 A1 | 1/2010 | Sato |
| 2010/0025675 A1 | 2/2010 | Yamazaki et al. |
| 2010/0079169 A1 | 4/2010 | Kim et al. |
| 2010/0085081 A1 | 4/2010 | Ofuji et al. |
| 2010/0244022 A1 | 9/2010 | Takahashi et al. |
| 2011/0175647 A1 | 7/2011 | Kim et al. |
| 2011/0315936 A1* | 12/2011 | Inoue et al. .................... 252/512 |
| 2012/0273779 A1 | 11/2012 | Yamazaki et al. |
| 2015/0060850 A1 | 3/2015 | Yamazaki et al. |

FOREIGN PATENT DOCUMENTS

| | | |
|---|---|---|
| JP | 2009-176865 A | 8/2009 |
| JP | 2010-020322 A | 1/2010 |
| JP | 2010-027851 A | 2/2010 |
| JP | 2010-56546 A | 3/2010 |
| JP | 2010-087518 A | 4/2010 |
| KR | 10-0448448 B1 | 9/2004 |
| KR | 10-2009-0041506 A | 4/2009 |
| KR | 10-2010-0037407 A | 4/2010 |

\* cited by examiner (a)

(b)

(c)

THIN FILM TRANSISTOR SUBSTRATE, METHOD FOR PRODUCING THE SAME, AND DISPLAY DEVICE

TECHNICAL FIELD

The present disclosure relates to thin film transistor substrates, and more particularly to a thin film transistor substrate using a semiconductor layer of an oxide semiconductor, a method for producing the substrate, and a display device.

BACKGROUND ART

In an active matrix substrate, a thin film transistor (hereinafter also referred to as a "TFT"), for example, is provided as a switching device in each pixel, which is a minimum unit of an image.

For a recent active matrix substrate, as a switching device as a minimum unit of an image, a TFT using a semiconductor layer of an oxide semiconductor (hereinafter also referred to as an oxide semiconductor layer) formed by an IGZO (In—Ga—Zn—O)-based oxide semiconductor film having high mobility has been proposed as a replacement of a conventional thin film transistor using a semiconductor layer of amorphous silicon.

More specifically, a TFT having a double gate structure including, for example, a first gate electrode provided on the insulating substrate, a first gate insulating film covering the first gate electrode, an oxide semiconductor layer provided on a first gate insulating film and overlapping the first gate electrode, source and drain electrodes connected to the oxide semiconductor layer, a second gate insulating film covering the oxide semiconductor layer, and a second gate electrode provided on the second gate insulating film, is proposed (see, for example, Patent Document 1).

CITATION LIST

Patent Document

PATENT DOCUMENT 1: Japanese Patent Publication No. 2009-176865

SUMMARY OF THE INVENTION

Technical Problem

A general display device integrated with peripheral circuits requires, for example, a thin film transistor intended to be used as a switching device for a pixel and having a small leakage current and a thin film transistor intended to be used for a peripheral circuit, having a low threshold voltage, and capable of being driven at high speed.

In the case of fabricating a peripheral circuit using a plurality of thin film transistors, CMOS inverters, each requiring both n-channel and p-channel, and enhancement/depletion (E/D) inverters, each constituted by two thin film transistors showing a large difference in threshold voltage, are widely used to achieve high-speed driving. However, most of the oxide semiconductors having high mobility, e.g., amorphous IGZO, show n-type (electron) conduction, and are not changed to show p-type (hole) conduction even by means of doping. Thus, CMOS circuit configurations cannot be applied to such oxide semiconductors.

For the above-described reason, there has been a problem in which a CMOS inverter circuit cannot be used in a circuit using an oxide semiconductor having high mobility. Thus, an E/D inverter circuit capable of controlling the threshold voltages of thin film transistors individually and operating at high speed is needed.

In the TFT described in Patent Document 1, however, double gate driving (i.e., driving performed by applying the same potential to a first gate electrode and a second gate electrode) can suppress occurrence of a hump, but even in the case of fabricating an inverter using two thin film transistors having the above-described double gate structure, it is still difficult to individually control the threshold voltages of the two thin film transistors constituting the inverter. Thus, Patent Document 1 has a problem in which the two thin film transistors cannot have different threshold voltages, i.e., the difference in threshold voltage between the two thin film transistors cannot be sufficiently increased.

It is therefore an object of the present disclosure to provide a thin film transistor substrate capable of forming a plurality of thin film transistors having different threshold voltages using a simple configuration, a method for producing such a thin film transistor substrate, and a display device.

Solution to the Problem

To achieve the object, a thin film transistor substrate according to the present disclosure includes: an insulating substrate; a first thin film transistor including a first gate electrode located on the insulating substrate and a first semiconductor layer located on the first gate electrode and having a first channel region; a second thin film transistor including a second gate electrode located on the insulating substrate and a second semiconductor layer located on the second gate electrode and having a second channel region; an insulating film covering the first semiconductor layer and the second semiconductor layer; and a third gate electrode located on the insulating film and facing at least one of the first channel region or the second channel region with the insulating film interposed therebetween.

With this configuration, the threshold voltages of the first thin film transistor and the second thin film transistor can be controlled by adjusting the potential of a line coupled to the third gate electrode (i.e., a power supply line), thereby enabling the first thin film transistor and the second thin film transistor to have different threshold voltages. As a result, the difference in threshold voltage between the two thin film transistors can be sufficiently increased, thus making it possible to easily fabricate, using a simple configuration, the thin film transistor substrate including thin film transistors (i.e., an E/D inverter) of the first thin film transistor and the second thin film transistor having different threshold voltages.

In addition, since the third gate electrodes serve as noise shielding electrodes, noise can be effectively reduced in the first and second thin film transistors. As a result, the voltages of the source electrode and the drain electrode provided in each of the first and second thin film transistors can be stabilized.

In the thin film transistor substrate, the third gate electrode is preferably made of at least one metal oxide selected from the group consisting of indium tin oxide (ITO), indium zinc oxide (IZO), indium tin oxide containing silicon oxide (ITSO), indium oxide ($In_2O_3$), tin oxide ($SnO_2$), and zinc oxide (ZnO).

In this configuration, a transparent metal oxide such as indium tin oxide (ITO) is used. As a result, in determining a design layout, flexible design can be achieved without a decrease in aperture ratio of pixels depending on arrangement of the line coupled to the third gate electrode.

In the thin film transistor substrate, each of the first semiconductor layer and the second semiconductor layer is preferably an oxide semiconductor layer.

With this configuration, a thin film transistor having higher electron mobility and enabling a lower-temperature process than a thin film transistor using amorphous silicon for a semiconductor layer can be obtained.

In the thin film transistor substrate, the oxide semiconductor layer is preferably made of at least one metal oxide selected from the group consisting of indium (In), gallium (Ga), aluminium (Al), copper (Cu), and zinc (Zn).

With this configuration, even if the oxide semiconductor layer made of the above-described material is amorphous, high mobility thereof can increase the ON resistance of switching devices.

In the thin film transistor substrate, the oxide semiconductor layer is preferably made of indium gallium zinc oxide (IGZO).

With this configuration, the thin film transistors can obtain excellent characteristics of high mobility and low off-current.

In the thin film transistor substrate, each of the first semiconductor layer and the second semiconductor layer is preferably a silicon-based semiconductor layer.

The thin film transistor substrate may further include: a third thin film transistor located on the insulating substrate; and a transparent electrode located on the insulating film and constituting an auxiliary capacitor of the third thin film transistor, wherein the third gate electrode and the transparent electrode may be made of an identical material.

With this configuration, since the third gate electrode and the transparent electrode are made of an identical material, the third gate electrode and the transparent electrode can be formed at a time using an identical material. As a result, processes of producing the thin film transistor substrate can be simplified, and the cost can be reduced.

The thin film transistor substrate has an excellent characteristic of enabling, using a simple configuration, easy production of a thin film transistor substrate including thin film transistors (i.e., an E/D inverter) of the first thin film transistor and the second thin film transistor having different threshold voltages. Thus, the thin film transistor substrate is preferably applicable to a display device including the thin film transistor substrate; a counter substrate opposed to the thin film transistor substrate; and a display medium layer sandwiched between the thin film transistor substrate and the counter substrate. The display device is preferably applicable to a display device in which the display medium layer is a liquid crystal layer.

A method for producing a thin film transistor substrate according to the present disclosure is a method for producing a thin film transistor substrate including: an insulating substrate; a first thin film transistor including a first gate electrode located on the insulating substrate and a first semiconductor layer located on the first gate electrode and having a first channel region; a second thin film transistor including a second gate electrode located on the insulating substrate and a second semiconductor layer located on the second gate electrode and having a second channel region; and an insulating film covering the first semiconductor layer and the second semiconductor layer, and the method includes: a first and second gate electrode formation step of forming the first gate electrode and the second gate electrode on the insulating substrate; a semiconductor layer formation step of forming the first semiconductor layer on the first gate electrode and forming the second semiconductor layer on the second gate electrode; an insulating film formation step of forming the insulating film such that the insulating film covers the first semiconductor layer and the second semiconductor layer; and a third gate electrode formation step of forming a third gate electrode on the insulating film such that the third gate electrode faces at least one of the first channel region or the second channel region.

With this configuration, the threshold voltages of the first thin film transistor and the second thin film transistor can be controlled by adjusting the potential of a line coupled to the third gate electrode (i.e., a power supply line), thereby fabricating the thin film transistor substrate in which the first thin film transistor and the second thin film transistor are enabled to have different threshold voltages. As a result, the difference in threshold voltage between the two thin film transistors can be sufficiently increased, thus making it possible to easily produce, using a simple configuration, the thin film transistor substrate including thin film transistors (i.e., an E/D inverter) of the first thin film transistor and the second thin film transistor having different threshold voltages.

In addition, since the third gate electrodes serve as noise shielding electrodes, noise can be effectively reduced in the first and second thin film transistors. As a result, the voltages of the source electrode and the drain electrode provided in each of the first and second thin film transistors can be stabilized.

In the method for producing the thin film transistor substrate, the thin film transistor substrate may further include a third thin film transistor substrate located on the insulating substrate, and in the third gate electrode formation step, the third gate electrode and a transparent electrode constituting an auxiliary capacitor of the third thin film transistor may be formed at a time using an identical material.

With this configuration, the third gate electrode and the transparent electrode can be formed at a time using an identical material, resulting in that fabrication processes can be simplified, and the cost can be reduced.

Advantages of the Invention

According to the present disclosure, it is possible to easily produce, using a simple configuration, a thin film transistor substrate including a plurality of thin film transistors having different threshold voltages.

DESCRIPTION OF EMBODIMENTS

An embodiment of the present disclosure will be described hereinafter with reference to the drawings. The present disclosure is not limited to the following embodiment.

Figure 1:
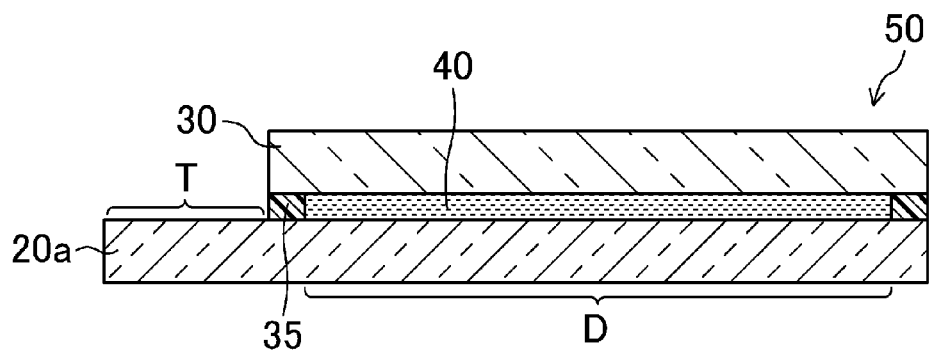
FIG. 1 is a cross-sectional view illustrating a liquid crystal display device including an active matrix substrate (a thin film transistor substrate) including thin film transistors according to an embodiment of the present disclosure.
Figure 2:
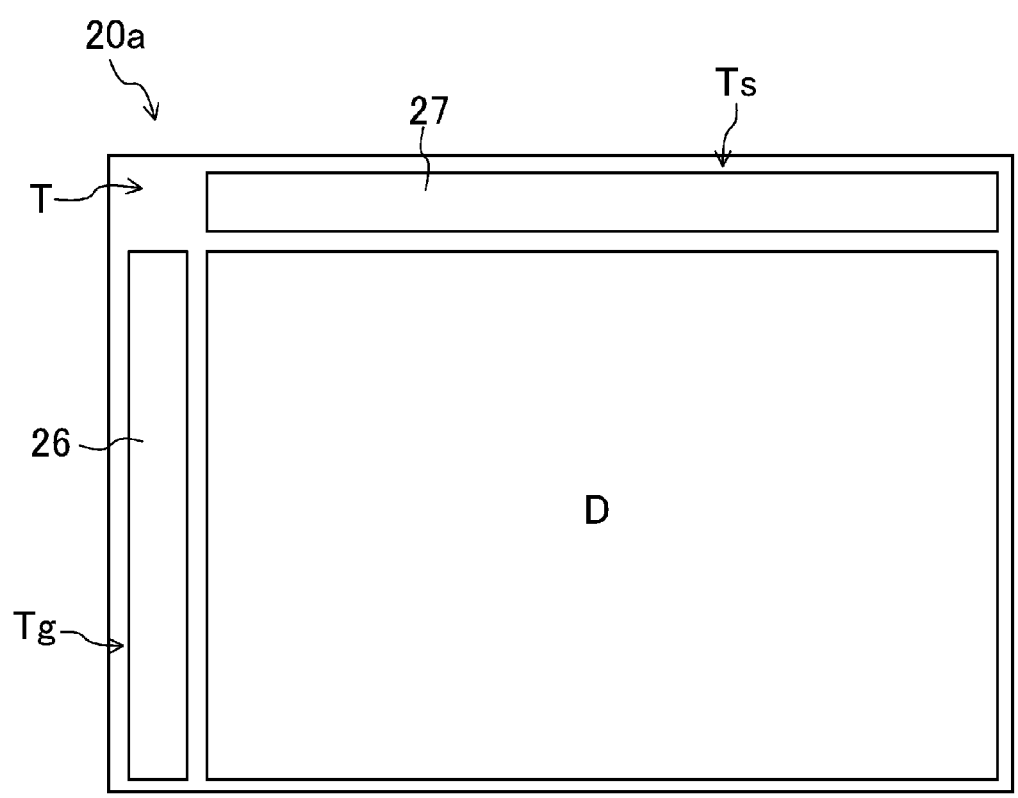
FIG. 2 is a plan view illustrating the active matrix substrate including the thin film transistors of the embodiment.
Figure 3:
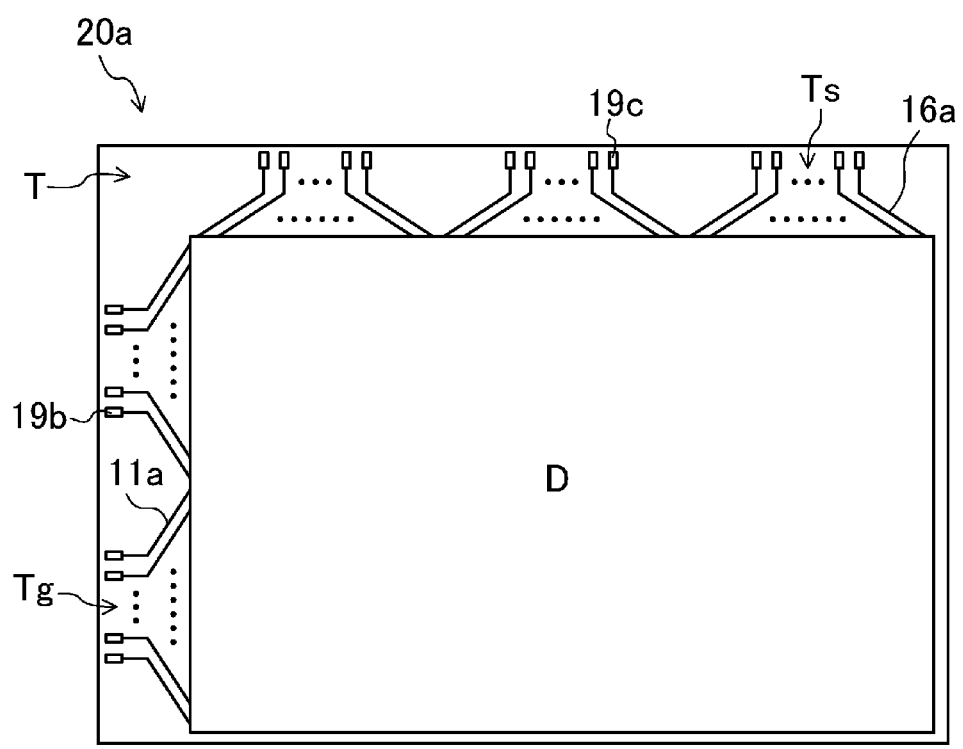
FIG. 3 is a plan view illustrating the active matrix substrate including the thin film transistors of the embodiment.
Figure 4:
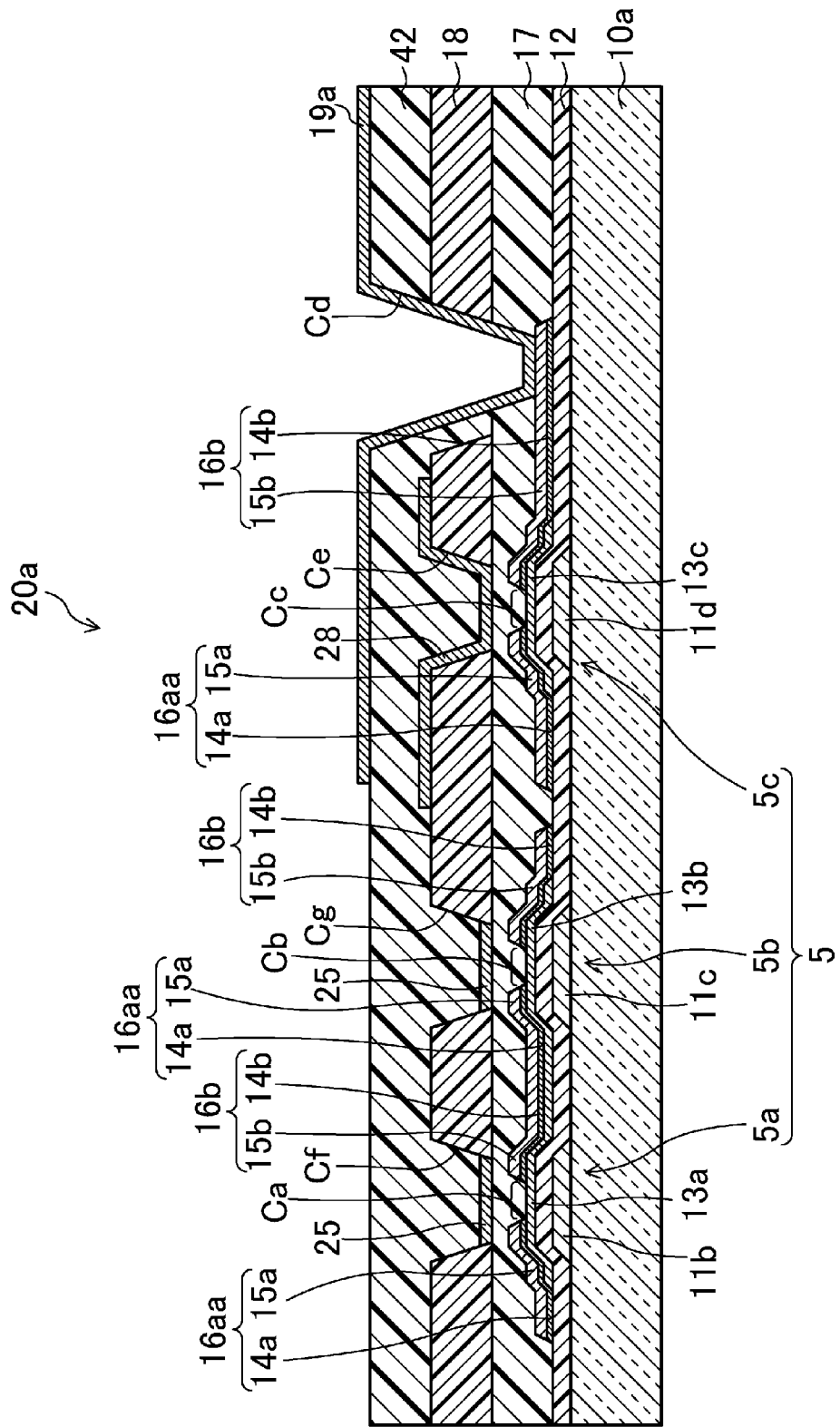
FIG. 4 is a cross-sectional view illustrating the active matrix substrate of the embodiment.

FIG. 1 is a cross-sectional view illustrating a liquid crystal display device including an active matrix substrate (a thin film transistor substrate) including thin film transistors according to an embodiment of the present disclosure. FIG. 2 is a plan view illustrating the active matrix substrate including the thin film transistors of the embodiment. FIG. 3 is a plan view illustrating the active matrix substrate including the thin film transistors of the embodiment. FIG. 4 is a cross-sectional view illustrating the active matrix substrate of the embodiment.

As illustrated in FIG. 1, a liquid crystal display device 50 includes an active matrix substrate 20a and a counter substrate 30 that are opposed to each other, and a liquid crystal layer 40 that is a display medium layer sandwiched between the active matrix substrate 20a and the counter substrate 30. The liquid crystal display device 50 also includes a sealing material 35 that bonds the active matrix substrate 20a and the counter substrate 30 together and has a frame shape for enclosing the liquid crystal layer 40 between the active matrix substrate 20a and the counter substrate 30.

As illustrated in FIGS. 1-3, the liquid crystal display device 50 has a display region D including, for example, a plurality of pixels and used for displaying an image on a portion surrounded by the sealing material 35, and a drive circuit region (a terminal region) T on a portion of the active matrix substrate 20a projecting from the counter substrate 30 when viewed from above. As illustrated in FIGS. 2 and 3, the drive circuit region T is located around the display region D.

The drive circuit region T includes a gate driver region Tg and a source driver region Ts. A gate driver 26 for driving scanning lines (gate lines) 11a in the display region D is provided on the gate driver region Tg. A source driver 27 for driving signal lines (source lines) 16a in the display region D is provided on the source driver region Ts.

As illustrated in FIGS. 3 and 4, the active matrix substrate 20a includes an insulating substrate 10a and also includes, in the display region D, a plurality of scanning lines 11a extending in parallel with each other on the insulating substrate 10a and a plurality of parallel signal lines 16a on the insulating substrate 10a.

The active matrix substrate 20a includes thin film transistors 5. As illustrated in FIG. 4, each of the thin film transistors 5 is an active device of a drive circuit (i.e., the gate driver 26), and is constituted by a first thin film transistor 5a and a second thin film transistor 5b that are located on the insulating substrate 10a, and a third thin film transistor 5c that is a switching device for a pixel and located on the insulating substrate 10a.

As illustrated in FIG. 4, the active matrix substrate 20a includes a second gate insulating film 17 covering the first thin film transistor 5a, the second thin film transistor 5b, and the third thin film transistor 5c, and a planarized film 18 covering the second gate insulating film 17. The active matrix substrate 20a includes a transparent electrode 28 provided on the surface of the planarized film 18 and made of, for example, indium tin oxide (ITO), an interlayer insulating film 42 provided on the surface of the transparent electrode 28, a plurality of pixel electrodes 19a arranged in a matrix on the interlayer insulating film 42 and connected to the third thin film transistor 5c, and an alignment film (not shown) covering the pixel electrodes 19a.

In this embodiment, the third thin film transistor 5c employs a structure (a stack structure) in which an auxiliary capacitor is constituted by the transparent electrode 28 and the pixel electrodes 19a described above.

As illustrated in FIG. 3, the scanning lines 11a extend to the gate driver region Tg of the drive circuit region T, and are connected to gate terminals 19b in the gate driver region Tg.

As illustrated in FIG. 3, the signal lines 16a extend, as relay lines, to the source driver region Ts of the drive circuit region T, and are connected to source terminals 19c in the source driver region Ts.

As illustrated in FIG. 4, the first thin film transistor 5a includes a first gate electrode 11b located on the insulating substrate 10a, a first gate insulating film 12 covering the first gate electrode 11b, and a first oxide semiconductor layer 13a located on the first gate insulating film 12 and having an island-shape first channel region Ca overlapping with the first gate electrode 11b. The first thin film transistor 5a also includes source and drain electrodes 16aa and 16b provided on the first oxide semiconductor layer 13a, overlapping with the first gate electrode 11b, and facing each other with the first channel region Ca interposed therebetween.

Likewise, as illustrated in FIG. 4, the second thin film transistor 5b includes a second gate electrode 11c located on the insulating substrate 10a, the first gate insulating film 12 covering the second gate electrode 11c, and a second oxide semiconductor layer 13b located on the first gate insulating film 12 and having an island-shape second channel region Cb overlapping with the second gate electrode 11c. The second thin film transistor 5b also includes source and drain electrodes 16aa and 16b provided on the second oxide semiconductor layer 13b, overlapping with the second gate electrode 11c, and facing each other with the second channel region Cb interposed therebetween.

The third thin film transistor 5c has a bottom-gate structure, and as illustrated in FIG. 4, includes a fourth gate electrode 11d located on the insulating substrate 10a, the first gate insulating film 12 covering the fourth gate electrode 11d, and a third oxide semiconductor layer 13c located on the first gate insulating film 12 and having an island-shape third channel region Cc overlapping with the fourth gate electrode 11d. The third thin film transistor 5c also includes source and drain electrodes 16aa and 16b provided on the third oxide semiconductor layer 13c, overlapping with the fourth gate electrode 11d, and facing each other with the third channel region Cc interposed therebetween.

Each of the first through third oxide semiconductor layers 13a, 13b, and 13c is made of an oxide semiconductor film of, for example, indium gallium zinc oxide (IGZO).

The source electrode 16aa projects from a side of an associated one of the signal lines 16a, and as illustrated in FIG. 4, is made of a multilayer film of a first conductive layer 14a and second conductive layer 15a. As illustrated in FIG. 4, the drain electrode 16b is made of a multilayer film of a first conductive layer 14b and a second conductive layer 15b.

The drain electrode 16b constituting the third thin film transistor 5c is connected to an associated one of the pixel electrodes 19a through a contact hole Cd formed in a multilayer film of the second gate insulating film 17, the planarized film 18, and the interlayer insulating film 42.

As illustrated in FIG. 14C, which will be referred to later, the counter substrate 30 includes an insulating substrate 10b and a color filter layer including colored films 22 located on the insulating substrate 10b and including a lattice-shaped black matrix 21 and colored films 22, such as a red film, a green film, and a blue film, provided in the respective lattices of the black matrix 21. The counter substrate 30 also includes a common electrode 23 covering the color filter layer, photospacers 24 located on the common electrode 23, and an alignment film (not shown) covering the common electrode 23.

The liquid crystal layer 40 is made of, for example, a nematic liquid crystal material having electrooptic properties.

In each of the pixels in the liquid crystal display device 50 having the above-described configuration, a gate signal is transmitted from the gate driver 26 to the fourth gate electrode 11d through the scanning line 11a. When the third thin film transistor 5c is turned on, a source signal is sent from the source driver 27 to the source electrode 16aa through the signal line 16a. In this manner, a predetermined amount of charge is written in the pixel electrode 19a through the third oxide semiconductor layer 13c and the drain electrode 16b.

In this process, a potential difference occurs between each of the pixel electrodes 19a of the active matrix substrate 20a and the common electrode 23 of the counter substrate 30, resulting in that a predetermined voltage is applied to the liquid crystal layer 40, i.e., the liquid crystal capacitor of each pixel and an auxiliary capacitor connected in parallel to the liquid crystal capacitor.

In each of the pixels in the liquid crystal display device 50, the alignment state of the liquid crystal layer 40 is changed depending on the level of the voltage applied to the liquid crystal layer 40. In this manner, an image is displayed with adjustment of the light transmittance of the liquid crystal layer 40.

As a feature of this embodiment, as illustrated in FIG. 4, in the first thin film transistor 5a serving as an active device of a drive circuit (i.e., the gate driver 26 or the source driver 27), a third gate electrode 25 constituted by the transparent electrode is provided above the first channel region Ca of the first oxide semiconductor layer 13a. As another feature, in the second thin film transistor 5b serving as an active device of the drive circuit (i.e., the gate driver 26 or the source driver 27), the third gate electrode 25 constituted by the transparent electrode is provided above the second channel region Cb of the second oxide semiconductor layer 13b.

More specifically, as illustrated in FIG. 4, in the first and second thin film transistors 5a and 5b, the third gate electrode 25 faces the channel region Ca of the first oxide semiconductor layer 13a and faces the channel region Cb of the second oxide semiconductor layer 13b with the second gate insulating film 17 interposed therebetween.

With this configuration, the threshold voltages of the first thin film transistor 5a and the second thin film transistor 5b can be controlled by adjusting the potential of a line coupled to ground (i.e., a power supply line), thereby enabling the first thin film transistor 5a and the second thin film transistor 5b to have different threshold voltages. As a result, the difference in threshold voltage between the first thin film transistor 5a and the second thin film transistor 5b can be sufficiently increased.

Figure 5:
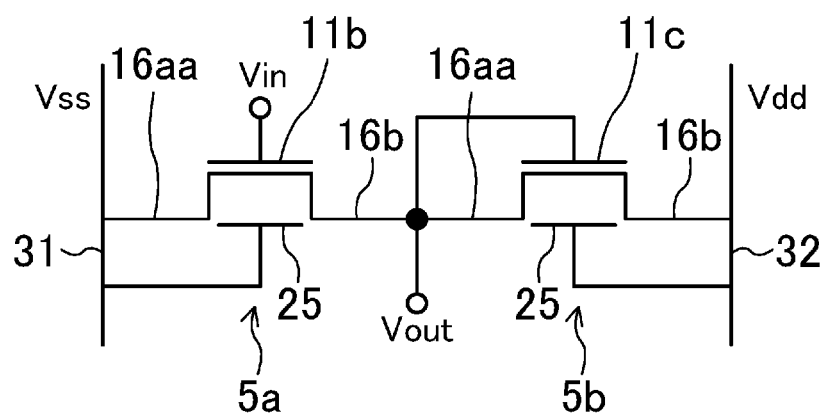
FIG. 5 is a circuit diagram illustrating a thin film transistor according to the embodiment.

More specifically, as illustrated in FIG. 5, the third gate electrode 25 of the first thin film transistor 5a is connected to a line 31 having a potential $V_{ss}$, and the third gate electrode 25 of the second thin film transistor 5b is connected to a line 32 having a potential $V_{dd}$ different from the potential of the line 31, thereby controlling the threshold voltages of the first thin film transistor 5a and the second thin film transistor 5b such that the first thin film transistor 5a and the second thin film transistor 5b have different threshold voltages.

As a result, it is possible to easily produce, using a simple configuration, the active matrix substrate 20a including thin film transistors (i.e., an E/D inverter) of the first thin film transistor 5a and the second thin film transistor 5b having different threshold voltages.

In addition, since the third gate electrodes 25 serve as noise shielding electrodes, noise can be effectively reduced in the first and second thin film transistors 5a and 5b, thereby stabilizing the voltages of the source electrode 16aa and the drain electrode 16b.

In the conventional technique described above, the second gate electrode is made of molybdenum (Mo), which is different from indium tin oxide (ITO) forming the transparent electrode. Thus, in employing the above-described stack structure, the second gate electrode and the transparent electrode cannot be formed at a time using an identical material.

On the other hand, in this embodiment, the third gate electrodes 25 and the transparent electrode 28 constituting the auxiliary capacitor can be formed at a time using an identical material. As a result, fabrication processes can be simplified, and the cost can be reduced.

Examples of the material constituting the third gate electrode 25 and the transparent electrode 28 include materials that are transparent or translucent, i.e., transmit light therethrough, such as indium zinc oxide (IZO), indium tin oxide containing silicon oxide (ITSO), indium oxide ($In_2O_3$), tin oxide ($SnO_2$), or zinc oxide (ZnO), as well as indium tin oxide (ITO) described above.

In this embodiment, the first thin film transistor 5a is used as an enhancement type thin film transistor having a high threshold voltage, and the second thin film transistor 5b is used as a depletion type thin film transistor having a low threshold voltage. These first and second thin film transistors 5a and 5b constitute an enhancement/depletion (E/D) inverter showing a large difference in threshold voltage.

In addition, the third thin film transistor 5c is used, as an enhancement type thin film transistor having a high threshold voltage and a low leakage current, for a switching device for a pixel.

Next, an example method for fabricating the liquid crystal display device 50 according to this embodiment will be described with reference to FIGS. 6-14. FIGS. 6-13 are cross-sectional views illustrating process steps of forming thin film transistors and an active matrix substrate. FIG. 14 is a cross-sectional view illustrating process steps of forming a counter substrate. The fabrication method of this embodiment includes a thin film transistor and active matrix substrate formation step, a counter substrate formation step, and a liquid crystal injection step.

First, the thin film transistor and active matrix substrate formation step will be described.

<First and Second Gate Electrode Formation Step>

Figure 6:
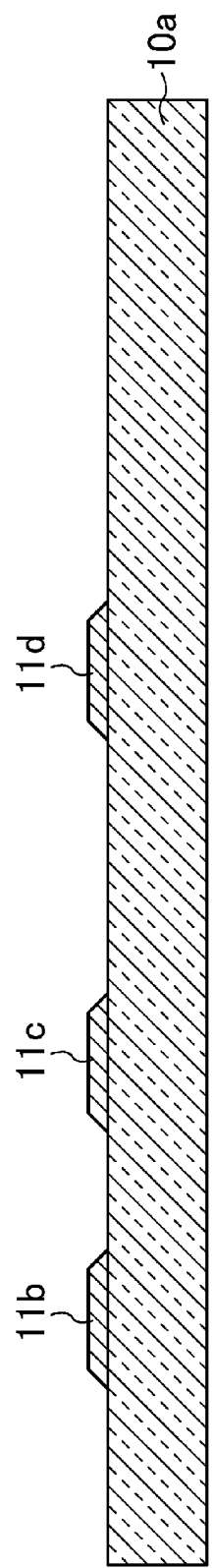
FIG. 6 is a cross-sectional view showing a process step of forming thin film transistors and an active matrix substrate according to the embodiment.

First, a molybdenum film (with a thickness of about 150 nm), for example, is deposited by spattering over the entire surface of an insulating substrate 10a, e.g., a glass substrate, a silicon substrate, or a heat-resistant plastic substrate. The molybdenum film is then subjected to photolithography, wet etching, removal of a resist, and irrigation, thereby forming a first gate electrode 11b and a second gate electrode 11c on an insulating substrate 10a, as illustrated in FIG. 6. Concurrently with formation of the first gate electrode 11b and the second gate electrode 11c, a fourth gate electrode 11d, scanning lines 11a, and signal lines 16a are formed.

In this embodiment, the molybdenum film with a single-layer structure is used as a metal film constituting the first gate electrode 11b, the second gate electrode 11c, and the fourth gate electrode 11d. Alternatively, these gate electrodes 11 may be formed to have a thickness of 50-300 nm by using, for example, a metal film such as an aluminium film, a tungsten film, a tantalum film, a chromium film, a titanium film, or a copper film, a film of an alloy containing at least one of these elements, or a metal nitride film.

Examples of a material forming the plastic substrate include a polyethylene terephthalate resin, a polyethylene naphthalate resin, a polyethersulfone resin, an acrylic resin, and a polyimide resin.

<First Gate Insulating Film Formation Step>

Figure 7:
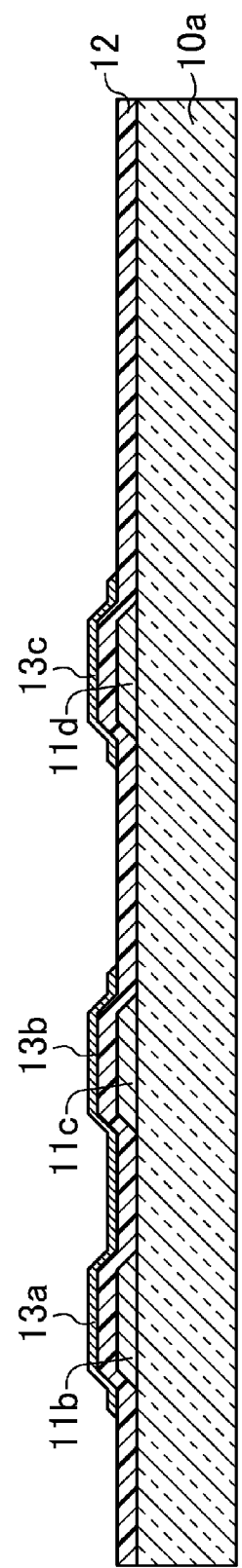
FIG. 7 is a cross-sectional view showing a process step of forming thin film transistors and an active matrix substrate according to the embodiment.

Next, a silicon nitride film (with a thickness of about 200-500 nm), for example, is deposited by CVD over the entire surface of the substrate on which the first gate electrode 11b, the second gate electrode 11c, and the fourth gate electrode 11d are formed, thereby forming a first gate insulating film 12 covering the first gate electrode 11b, the second gate electrode 11c, and the fourth gate electrode 11d, as illustrated in FIG. 7.

The first gate insulating film 12 may be made of a stack of two layers. In this case, in addition to the silicon nitride film (SiNx), a silicon oxide film (SiOx), a silicon oxynitride film (SiOxNy, x>y), or a silicon nitride oxide film (SiNxOy, x>y), for example, may be used.

To prevent diffusion of, for example, an impurity from the insulating substrate 10a, a silicon nitride film or a silicon nitride oxide film is preferably used as a lower gate insulating film, whereas a silicon oxide film or a silicon oxynitride film is preferably used as an upper gate insulating film.

For example, a silicon nitride film with a thickness of 100-200 nm may be formed as a lower gate insulating film using $SiH_4$ and $NH_3$ as a reactant gas, and a silicon oxide film with a thickness of 50-100 nm may be formed as an upper gate insulating film using $N_2O$ and $SiH_4$ as a reactant gas.

To deposit a dense first gate insulating layer 12 with a small gate leakage current at a low temperature, a rare gas such as an argon gas is preferably contained in the reactant gas to be mixed in the insulating film.

<Oxide Semiconductor Layer Formation Step>

Then, an IGZO-based oxide semiconductor film (with a thickness of about 30-100 nm), for example, is deposited by spattering. Thereafter, the oxide semiconductor film is subjected to photolithography, wet etching, removal of a resist, and irrigation, thereby forming first through third oxide semiconductor layers 13a, 13b, and 13c on the first gate electrode 11b, the second gate electrode 11c, and the fourth gate electrode 11d, as illustrated in FIG. 7.

<Source and Drain Formation Step>

Subsequently, a titanium film (with a thickness of 30-150 nm) and a copper film (with a thickness of about 50-400 nm), for example, are stacked in this order by spattering over the entire surface of the substrate on which the first through third oxide semiconductor layers 13a, 13b, and 13c are formed. Thereafter, the copper film is subjected to photolithography and wet etching, and the titanium film is subjected to dry etching, removal of a resist, and irrigation, thereby forming signal lines 16a (see FIG. 3), a source electrode 16aa, and a drain electrode 16b, as illustrated in FIG. 8.

In this step, a first channel region Ca of the first oxide semiconductor layer 13a, a second channel region Cb of the second oxide semiconductor layer 13b, and a third channel region Cc of the third oxide semiconductor layer 13c are exposed.

Figure 8:
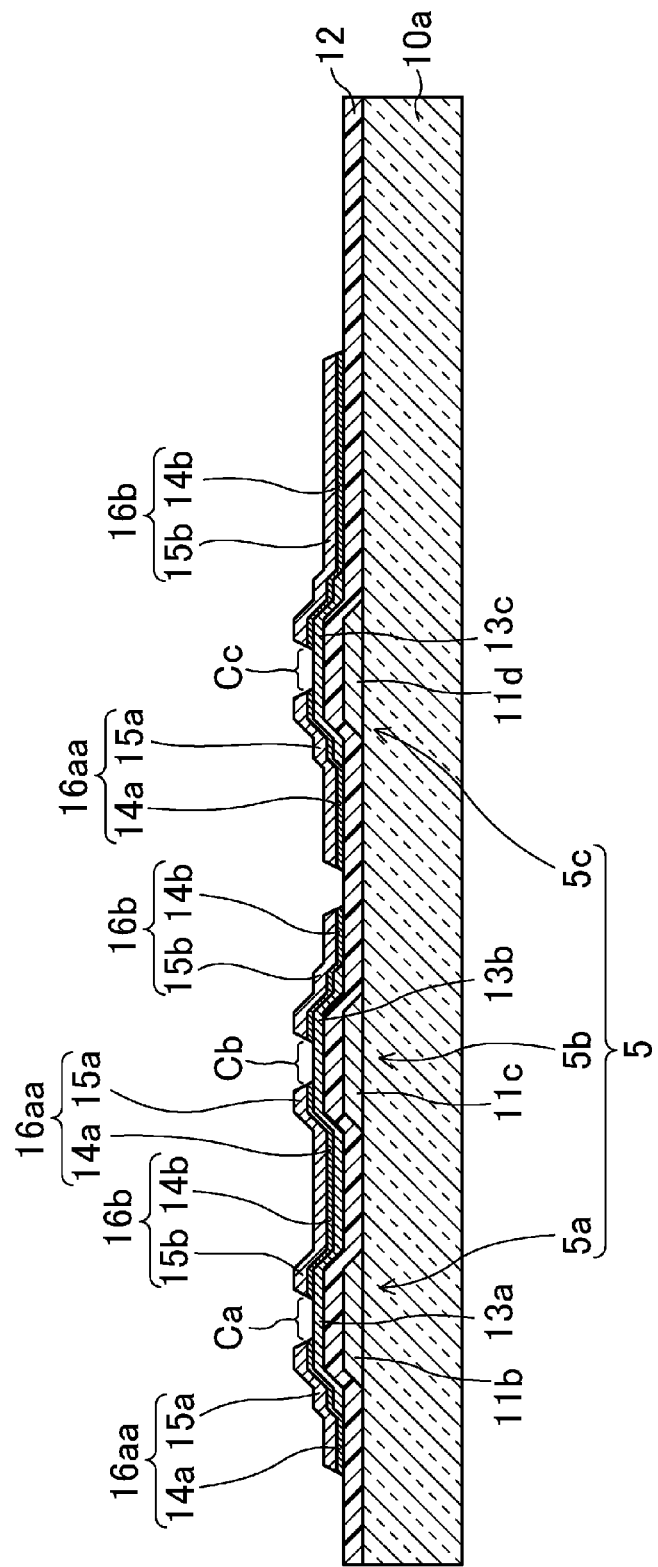
FIG. 8 is a cross-sectional view showing a process step of forming thin film transistors and an active matrix substrate according to the embodiment.

As also illustrated in FIG. 8, in the first thin film transistor 5a, the source electrode 16aa and the drain electrode 16b face each other with the first channel region Ca interposed therebetween.

Likewise, as illustrated in FIG. 8, in the second thin film transistor 5b, the source electrode 16aa and the drain electrode 16b face each other with the second channel region Cb interposed therebetween.

Likewise, as illustrated in FIG. 8, in the third thin film transistor 5c, the source electrode 16aa and the drain electrode 16b face each other with the third channel region Cc interposed therebetween.

In this embodiment, the stack of the titanium film and the copper film is used as a metal film constituting the source electrode 16aa and the drain electrode 16b. Alternatively, the source electrode 16aa and the drain electrode 16b may be made of, for example, a metal film such as an aluminium film, a tungsten film, a tantalum film, or a chromium film, a film of an alloy containing at least one of these elements, or a metal nitride film.

The conductive material may be a material that is transparent or translucent to light, e.g., indium tin oxide (ITO), indium zinc oxide (IZO), indium tin oxide containing silicon oxide (ITSO), indium oxide ($In_2O_3$), tin oxide ($SnO_2$), or zinc oxide (ZnO).

An etching process may be any one of dry etching or wet etching described above. However, in the case of producing a large-area substrate, dry etching is preferably used. Examples of an etching gas include a fluorine-based gas of, e.g., $CF_4$, $NF_3$, $SF_6$, or $CHF_3$, a chlorine-based gas of, e.g., $Cl_2$, $BCl_3$, $SiCl_4$, or $CCl_4$, and an oxygen gas. An inert gas of, for example, helium or argon may be added to the etching gas.

<Second Gate Insulating Film Formation Step>

Figure 9:
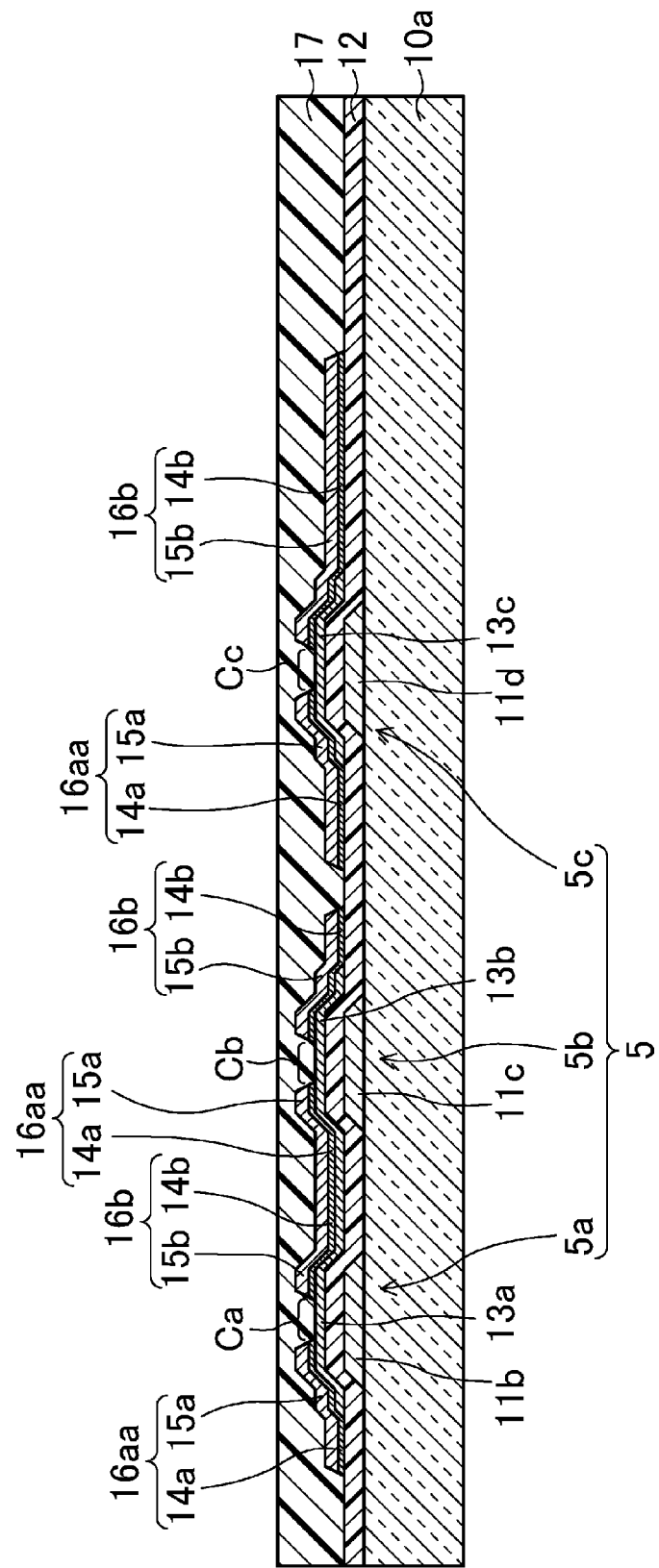
FIG. 9 is a cross-sectional view showing a process step of forming thin film transistors and an active matrix substrate according to the embodiment.

Thereafter, a silicon nitride film, a silicon oxide film, or a silicon nitride oxide film, for example, is deposited by plasma CVD over the entire surface of the substrate on which the source electrode 16aa and the drain electrode 16b (i.e., the first through third thin film transistors 5a, 5b, and 5c) are formed, thereby forming a second gate insulating film 17 covering the first through third oxide semiconductor layers 13a, 13b, and 13c, the source electrode 16aa, and the drain electrode 16b and having a thickness of about 200-300 nm, as illustrated in FIG. 9.

In this embodiment, as the second gate insulating film 17, a silicon oxide film with a thickness of 200-300 nm can be formed by, for example, plasma CVD using, for example, tetra ethyl ortho silicate (TEOS) as a source gas.

<Planarized Film Formation Step>

Figure 10:
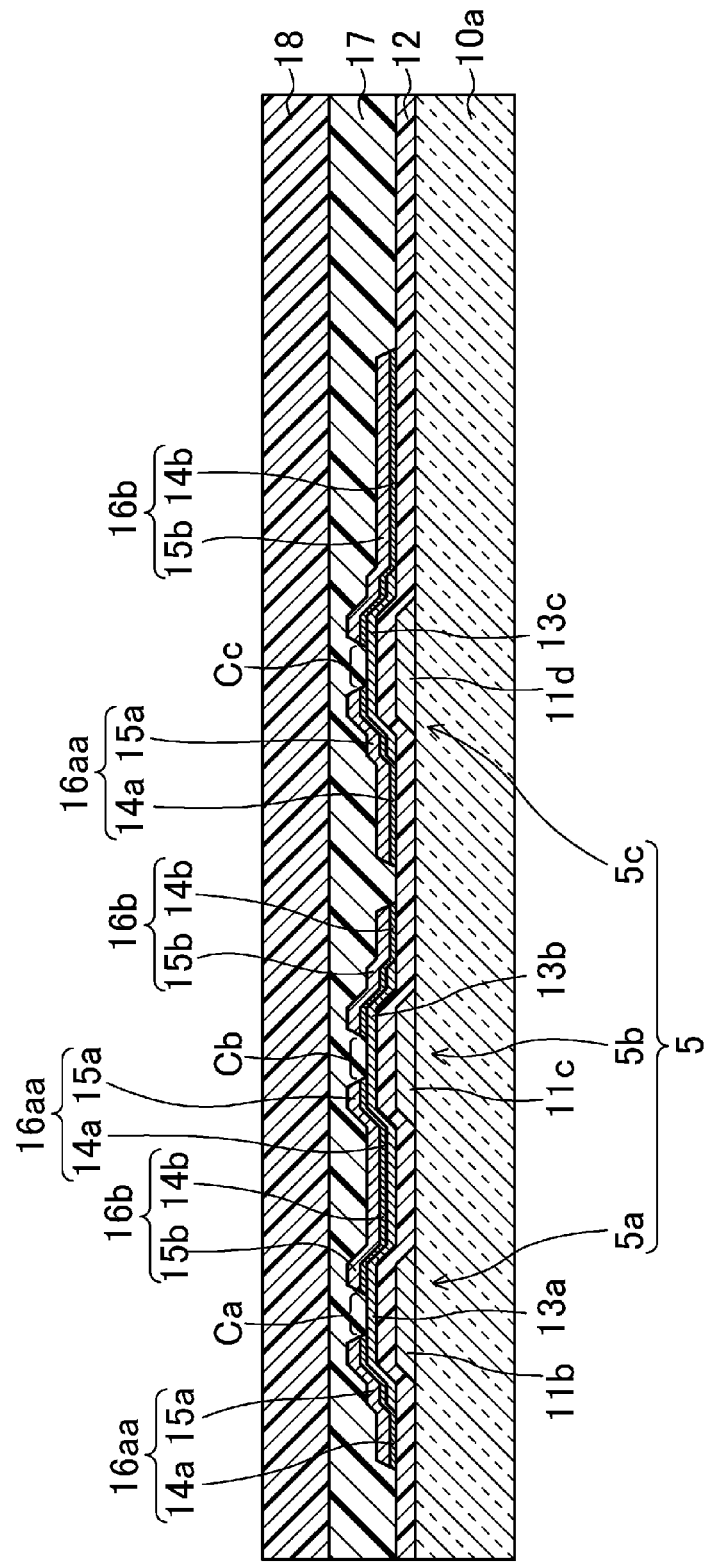
FIG. 10 is a cross-sectional view showing a process step of forming thin film transistors and an active matrix substrate according to the embodiment.

Subsequently, the entire surface of the substrate on which the second gate insulating film 17 is formed is coated with a photosensitive organic insulating film of, for example, a photosensitive acrylic resin with a thickness of about 1.0-3.0 μm by spin coating or slit coating, thereby forming a planarized film 18 on the surface of the second gate insulating film 17 such that the planarized film 18 covers the first oxide semiconductor layer 13a, the second oxide semiconductor layer 13b, and the third oxide semiconductor layer 13c, as illustrated in FIG. 10.

<Opening Formation Step>

Figure 11:
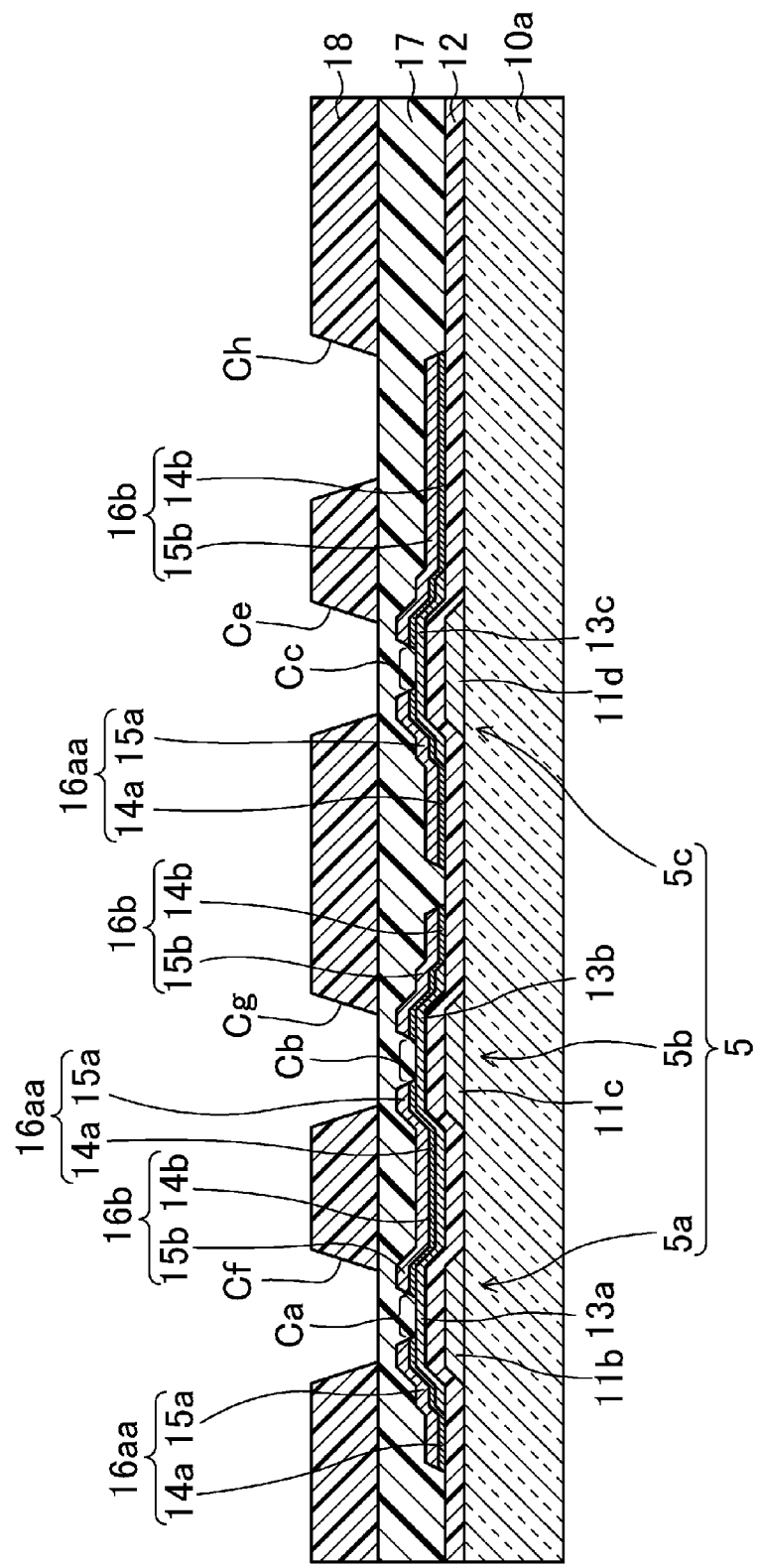
FIG. 11 is a cross-sectional view showing a process step of forming thin film transistors and an active matrix substrate according to the embodiment.

Then, the planarized film 18 is subjected to exposure to light and development, thereby forming, in the planarized film 18, openings Ce, Cf, and Cg located above the first through third thin film transistors 5a, 5b, and 5c, as illustrated in FIG. 11. In this step, as illustrated in FIG. 11, an opening Ch for a contact hole Cd is formed in the planarized film 18.

<Third Gate Electrode Formation Step>

Thereafter, a transparent conductive film such as an ITO film (with a thickness of about 50-200 nm) of indium tin oxide, for example, is deposited by spattering over the entire surface of the substrate on which the second gate insulating film 17 and the planarized film 18 are formed. Then, the transparent conductive film is subjected to photolithography, wet etching, removal of a resist, and irrigation, thereby forming a third gate electrode 25 of a transparent electrode on portions of the surface of the second gate insulating film 17 serving as the bottoms of the openings Cf and Cg, and also forming a transparent electrode 28 constituting an auxiliary capacitor of the third thin film transistor 5c on the inner wall of the opening Ce, as illustrated in FIG. 12.

Figure 12:
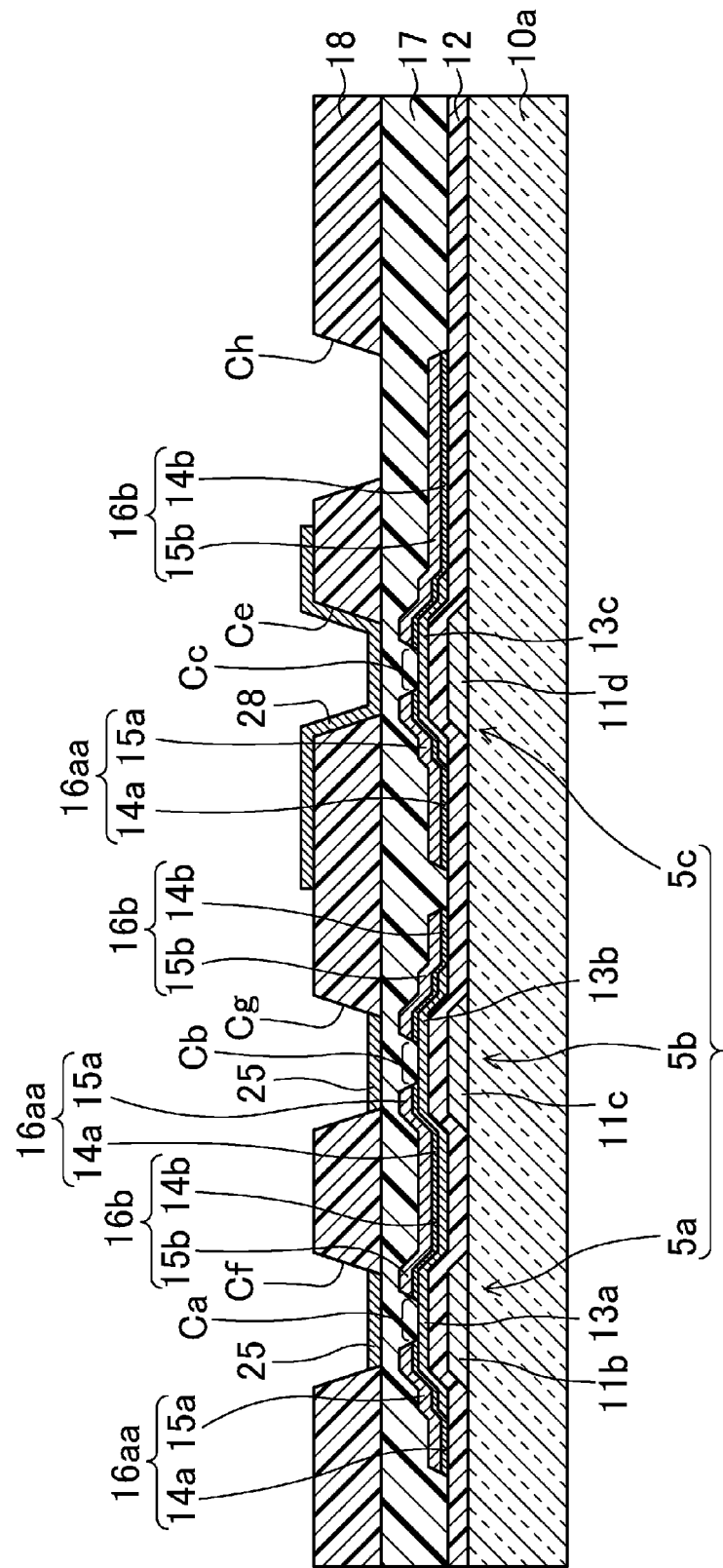
FIG. 12 is a cross-sectional view showing a process step of forming thin film transistors and an active matrix substrate according to the embodiment.

In this step, as illustrated in FIG. 12, in the first and second thin film transistors 5a and 5b, the third gate electrodes 25 face the channel regions Ca and Cb of the first and second oxide semiconductor layers 13a and 13b with the second gate insulating film 17 interposed therebetween. Thus, since the third gate electrodes 25 serve as noise shielding electrodes, noise can be effectively reduced in the first and second thin film transistors 5a and 5b, and the voltages of the source electrode 16aa and the drain electrode 16b can be stabilized.

In addition, since the third gate electrodes 25 and the transparent electrode 28 constituting the auxiliary capacitor can be formed at a time using an identical material, thereby simplifying fabrication process steps, and reducing the cost.

As described above, the threshold voltages of the first thin film transistor 5a and the second thin film transistor 5b are controlled by adjusting the potential of a line coupled to ground (i.e., a power supply line), thereby enabling the first thin film transistor 5a and the second thin film transistor 5b to have different threshold voltages. As a result, the difference in threshold voltage between the two transistors can be sufficiently increased.

<Interlayer Insulating Film Formation Step>

Figure 13:
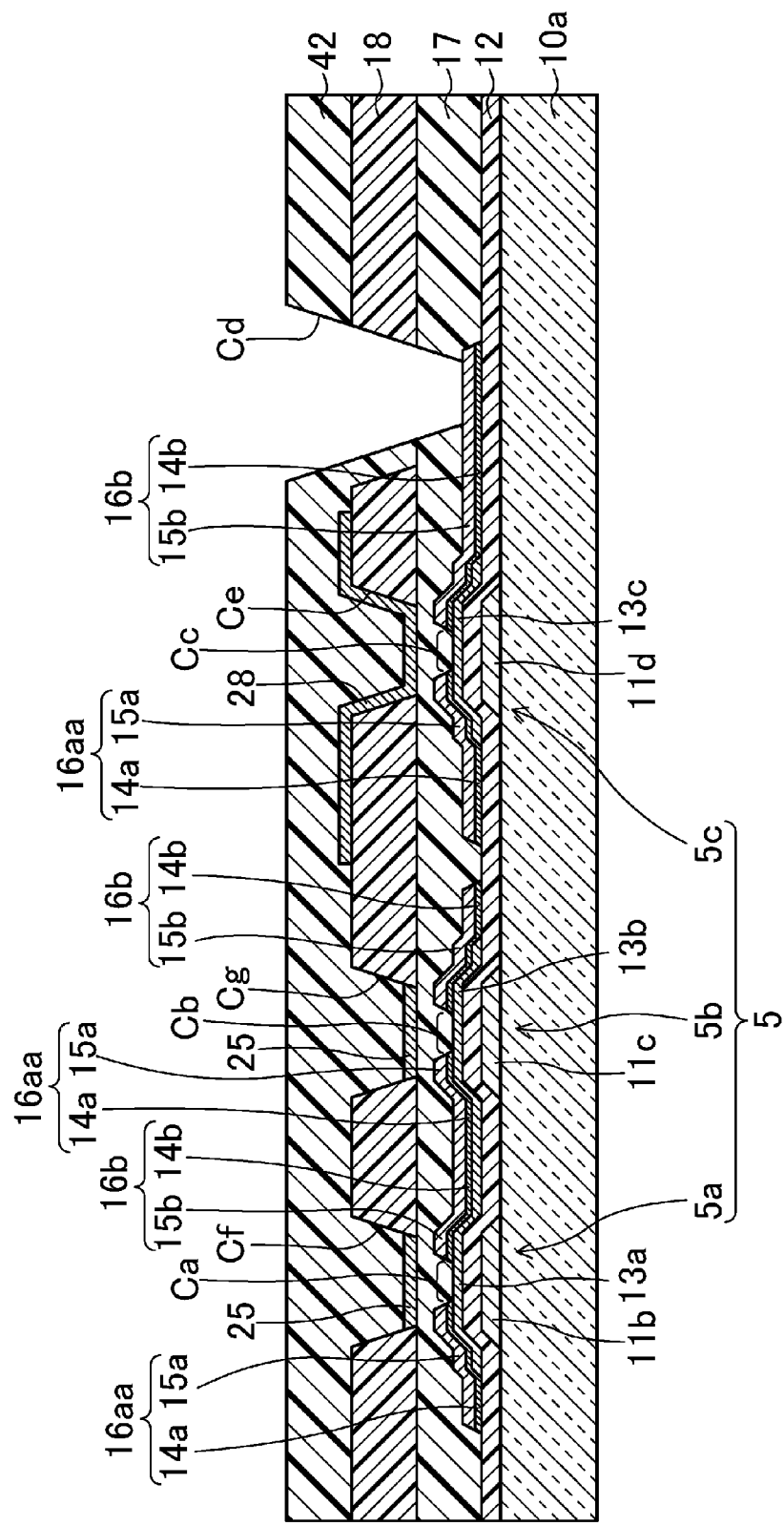
FIG. 13 is a cross-sectional view showing a process step of forming thin film transistors and an active matrix substrate according to the embodiment.
Figure 14:
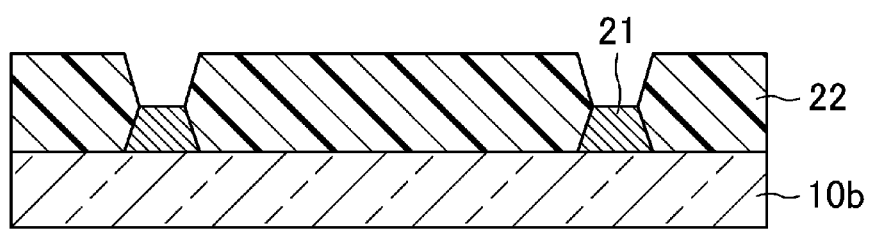
FIGS. 14A-14C are cross-sectional views showing process steps of forming a counter substrate.
Figure 14:
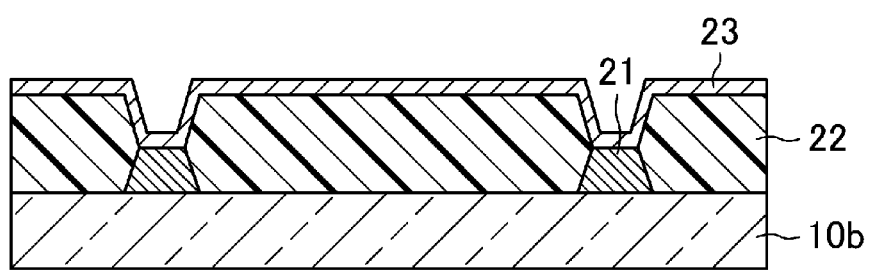
Figure 14:
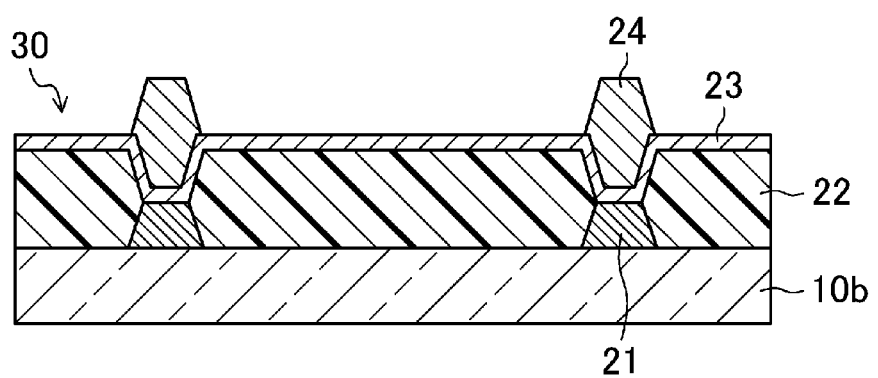

Thereafter, a silicon nitride film, a silicon oxide film, or a silicon nitride oxide film, for example, is deposited by plasma CVD over the entire surface of the substrate on which the third gate electrodes 25 and the transparent electrode 28 are formed, thereby forming an interlayer insulating film 42 covering the first through third thin film transistors 5a, 5b, and 5c (i.e., first through third oxide semiconductor layers 13a, 13b, and 13c, the source electrode 16aa, the drain electrode 16b, and the third gate electrode 25) and having a thickness of about 200-300 nm, as illustrated in FIG. 13.

<Contact Hole Formation Step>

Subsequently, the second gate insulating film 17, the planarized film 18, and the interlayer insulating film 42 are subjected to exposure to light and development, thereby forming a contact hole Cd that reaches the drain electrode 16b through the second gate insulating film 17, the planarized film 18, and the interlayer insulating film 42, as illustrated in FIG. 13.

<Pixel Electrode and Auxiliary Capacitor Formation Step>

Thereafter, a transparent conductive film such as an ITO film (with a thickness of about 50-200 nm) of indium tin oxide, for example, is deposited by spattering over the entire surface of the substrate on which the interlayer insulating film 42 is formed. Then, the transparent conductive film is subjected to photolithography, wet etching, removal of a resist, and irrigation, thereby forming pixel electrodes 19a, gate terminals 19b (see FIG. 3), and source terminals 19c (see FIG. 3), as illustrated in FIG. 4.

In this step, as illustrated in FIG. 4, the pixel electrodes 19a are formed on the surfaces of the second gate insulating film 17, the planarized film 18, and the interlayer insulating film 42 to cover the inner wall of the contact hole Cd.

In addition, in the third thin film transistor 5c, formation of the pixel electrode 19a enables formation of an auxiliary capacitor constituted by the transparent electrode 28 and the pixel electrode 19a. Accordingly, it is unnecessary to form an auxiliary capacitor line in the layer where the third thin film transistor 5c is formed, and thus, the aperture ratio of pixels in the active matrix substrate 20a can be increased.

In the case of forming a transmissive liquid crystal display device 50, the pixel electrodes 19a may be made of indium oxide containing tungsten oxide, indium zinc oxide (IZO), indium oxide containing titanium oxide, or indium tin oxide (ITO), for example. Instead of indium zinc oxide and indium tin oxide described above, indium tin oxide containing silicon oxide (ITSO) may be used, for example.

In the case of forming a reflective liquid crystal display device 50, a conductive film of titanium, tungsten, nickel, gold, platinum, silver, aluminium, magnesium, calcium, lithium, or an alloy containing at least one of these elements may be used as a reflective metal thin film, and this metal thin film may be used for the pixel electrodes 19a.

In the foregoing manner, an active matrix substrate 20a illustrated in FIG. 4 can be formed.

<Counter Substrate Formation Step>

First, the entire surface of the insulating substrate 10b such as a glass substrate is coated with, for example, a black-colored photosensitive resin by spin coating or slit coating, and then is exposed to light and developed, thereby forming a black matrix 21 with a thickness of about 1.0 μm, as illustrated in FIG. 14A.

Next, the entire surface of the substrate including the black matrix 21 is coated with, for example, a red-, green-, or blue-colored photosensitive resin by spin coating or slit coating, and then is exposed to light and developed, thereby forming a colored film 22 of a selected color (e.g., a red film) with a thickness of about 2.0 μm, as illustrated in FIG. 14A. Similar processes are repeatedly performed for the other two colors, thereby forming colored films 22 of the other two colors (e.g., a green film and a blue film) each with a thickness of about 2.0 μm.

Then, a transparent conductive film such as an ITO film, for example, is deposited by spattering over the substrate on which the colored films 22 are formed, thereby forming a common electrode 23 with a thickness of about 50-200 nm, as illustrated in FIG. 14B.

Lastly, the entire surface of the substrate on which the common electrode 23 is formed is coated with a photosensitive resin by spin coating or slit coating, and then is exposed to light and developed, thereby forming photospacers 24 each with a thickness of about 4 μm, as illustrated in FIG. 14C.

In the foregoing manner, a counter substrate 30 is formed.

<Liquid Crystal Injection Step>

First, a resin film of polyimide is applied by printing onto the surfaces of the active matrix substrate 20a formed by the above-descried active matrix substrate formation step and the counter substrate 30 formed by the above-descried counter substrate formation step, and is subjected to calcination and rubbing, thereby forming an alignment film.

Next, a sealing material 35 of, for example, an ultraviolet (UV)/thermosetting resin is printed in a frame shape on the surface of the counter substrate 30 on which the alignment film is formed, and then a liquid crystal material is dropped inside the frame of the sealing material.

Thereafter, the counter substrate 30 on which the liquid crystal material has been dropped and the active matrix substrate 20a on which the alignment film is formed are bonded together under a reduced pressure to form a bonded assembly. This bonded assembly is then exposed to the air under an atmospheric pressure, thereby pressurizing the front and back surfaces of the bonded assembly.

Subsequently, the sealing material 35 enclosed in the bonded assembly is irradiated with UV light, and then the bonded assembly is heated, thereby curing the sealing material 35.

Lastly, the bonded assembly enclosing the cured sealing material 35 is diced, for example, and unwanted portions thereof are removed.

In the foregoing manner, the liquid crystal display device 50 of this embodiment is fabricated.

The foregoing embodiment can obtain the following advantages.

(1) In this embodiment, the third gate electrodes 25 are provided on the second gate insulating film 17 to face the first channel region Ca and the second channel region Cb with the second gate insulating film 17 interposed therebetween. Thus, the threshold voltages of the first thin film transistor 5a and the second thin film transistor 5b can be controlled by connecting the third gate electrode 25 of the first thin film transistor 5a and the third gate electrode 25 of the second thin film transistor 5b to the lines 31 and 32 having different potentials, thereby enabling the first thin film transistor 5a and the second thin film transistor 5b to have different threshold voltages. As a result, it is possible to easily produce, using a simple configuration, the active matrix substrate 20a including thin film transistors (i.e., an E/D inverter) of the first thin film transistor 5a and the second thin film transistor 5b having different threshold voltages.

(2) Since the third gate electrodes 25 serve as noise shielding electrodes, noise can be effectively reduced in the first and second thin film transistors 5a and 5b, thereby stabilizing the voltages of the source electrode 16aa and the drain electrode 16b.

(3) In this embodiment, the third gate electrodes 25 are made of a transparent or translucent metal oxide, e.g., indium tin oxide (ITO), indium zinc oxide (IZO), indium tin oxide containing silicon oxide (ITSO), indium oxide ($In_2O_3$), tin oxide ($SnO_2$), or zinc oxide (ZnO). Thus, in determining a design layout, the use of the transparent metal oxide such as indium tin oxide (ITO) enables flexible design without a decrease in aperture ratio of pixels depending on arrangement of the lines coupled to the third gate electrodes 25.

(4) In this embodiment, the first oxide semiconductor layer 13a and the second oxide semiconductor layer 13b are used as semiconductor layers. Thus, the first thin film transistor 5a and the second thin film transistor 5b have higher electron mobility and enabling a lower-temperature process than a thin film transistor using amorphous silicon for semiconductor layers.

(5) In this embodiment, the first oxide semiconductor layer 13a and the second oxide semiconductor layer 13b are made of indium gallium zinc oxide (IGZO). Thus, the first thin film transistor 5a and the second thin film transistor 5b can obtain excellent characteristics of high mobility and low off-current.

(6) In this embodiment, the third gate electrodes 25 and the transparent electrode 28 are made of an identical material. Thus, the third gate electrodes 25 and the transparent electrode 28 can be formed at a time using an identical material, thereby simplifying process steps of producing the active matrix substrate 20a, and reducing the cost.

The above embodiment may be modified in the following manner.

The above embodiment employs the double gate structure in which the third gate electrode 25 is provided in each of the first and second thin film transistors 5a and 5b. Alternatively, the third gate electrode 25 only needs to be provided in at least one of the first and second thin film transistors 5a and 5b, and the third gate electrode 25 may be provided in one of the first thin film transistor 5a or the second thin film transistor 5b.

Figure 15:
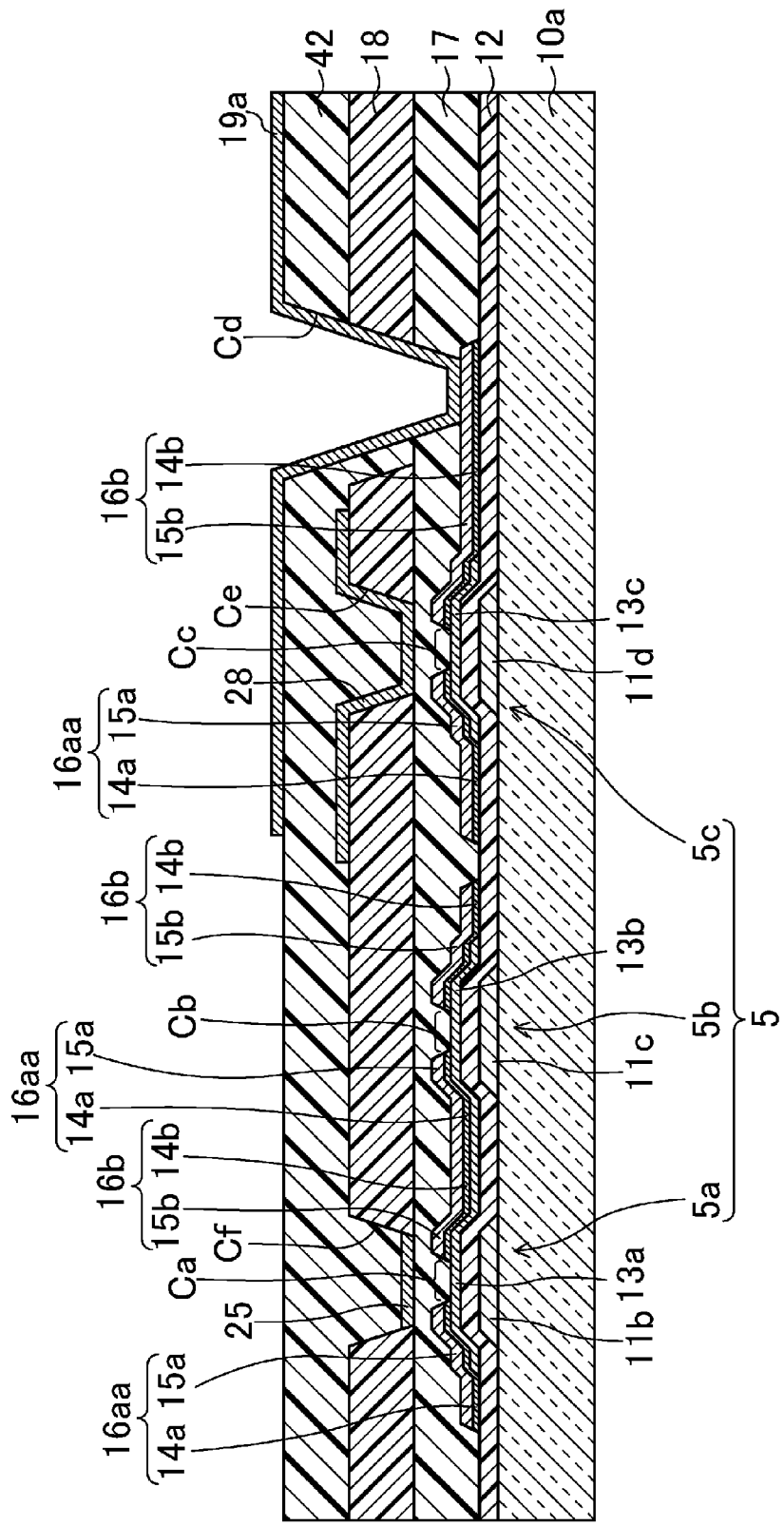
FIG. 15 is a cross-sectional view illustrating a thin film transistor according to a variation of the embodiment.

For example, as illustrated in FIG. 15, the third gate electrode 25 is provided only in the first thin film transistor 5a, and in the first thin film transistor 5a, the third gate electrode 25 faces the channel region Ca of the first oxide semiconductor layer 13a with the second gate insulating film 17 interposed therebetween.

Figure 16:
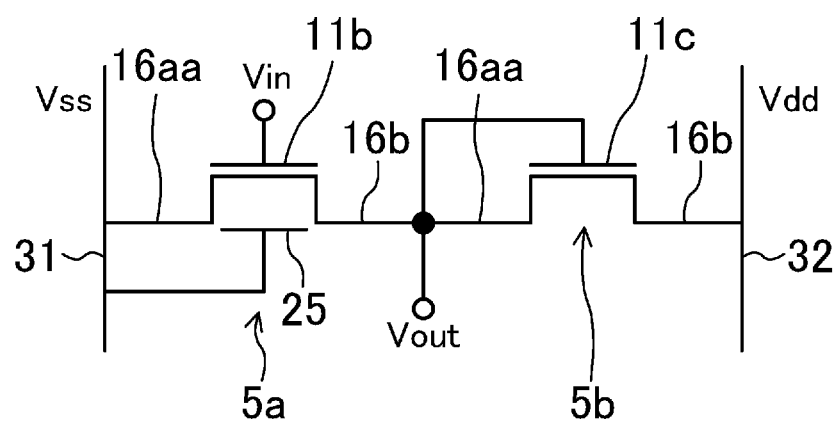
FIG. 16 is a circuit diagram illustrating the thin film transistor illustrated in FIG. 15.

In this case, as illustrated in FIG. 16, the third gate electrode 25 of the first thin film transistor 5a is connected to the line 31 having a potential $V_{ss}$, and the drain electrode 16b of the second thin film transistor 5b is connected to the line 32 having a potential $V_{dd}$ different from the potential of the line 31, thereby controlling the threshold voltages of the first thin film transistor 5a and the second thin film transistor 5b such that the first thin film transistor 5a and the second thin film transistor 5b have different threshold voltages in the same manner as in the embodiment described above. Thus, advantages similar to advantages (1)-(6) described above can be obtained.

In this embodiment, oxide semiconductor layers are used as semiconductor layers. However, the semiconductor layers are not limited to those described above, and silicon-based semiconductor layers of amorphous silicon or polysilicon, for example, may be used as semiconductor layers of thin film transistors instead of the oxide semiconductor layers.

In the above embodiment, the oxide semiconductor layers are oxide semiconductor layers of indium gallium zinc oxide (IGZO). However, the oxide semiconductor layers are not limited to this example, and a material of a metal oxide containing at least one of indium (In), gallium (Ga), aluminium (Al), copper (Cu), zinc(Zn), magnesium (Mg), or cadmium (Cd) may be used.

Even if the oxide semiconductor layers made of the above-described material are amorphous, high mobility thereof can increase the ON resistance of switching devices. Accordingly, the difference in output voltage in reading data is increased, thereby enhancing the S/N ratio.

Instead of IGZO (In—Ga—Zn—O), $InGaO_3(ZnO)_5$, $Mg_xZn_{1-x}O$, $Cd_xZn_{1-x}O$, or CdO, for example, may be used.

One of group 1 elements, group 13 elements, group 14 elements, group 15 elements, and group 17 elements; ZnO to which a plurality of types of impurities are added in one of an amorphous state, a polycrystalline state, or a microcrystalline state as a mixture of the amorphous state and the polycrystalline state; or ZnO to which none of the above-mentioned impurities are added, may be used.

INDUSTRIAL APPLICABILITY

The present disclosure is applicable to a thin film transistor substrate using a semiconductor layer of an oxide semiconductor, and a method for producing the thin film transistor substrate using the semiconductor layer, and a display device.

DESCRIPTION OF REFERENCE CHARACTERS 5 thin film transistor
5a first thin film transistor
5b second thin film transistor
5c third thin film transistor
10a insulating substrate
11b first gate electrode
11c second gate electrode
11d fourth gate electrode
12 first gate insulating film
13a first oxide semiconductor layer (first semiconductor layer)
13b second oxide semiconductor layer (second semiconductor layer)
13c third oxide semiconductor layer
16aa source electrode
16b drain electrode
17 second gate insulating film (insulating film)
18 planarized film
19a pixel electrode
20a active matrix substrate (thin film transistor substrate)
25 third gate electrode
28 transparent electrode
30 counter substrate
40 liquid crystal layer (display medium layer)
50 liquid crystal display device
Ca first channel region
Cb second channel region

The invention claimed is:

1. A thin film transistor substrate, comprising:
an insulating substrate;
a first thin film transistor including a first gate electrode located on the insulating substrate and a first semiconductor layer located on the first gate electrode and having a first channel region;
a second thin film transistor including a second gate electrode located on the insulating substrate and a second semiconductor layer located on the second gate electrode and having a second channel region;
an insulating film covering the first semiconductor layer and the second semiconductor layer;
a third gate electrode located on the insulating film and facing at least one of the first channel region or the second channel region with the insulating film interposed therebetween;
a third thin film transistor located on the insulating substrate; and
a transparent electrode located on the insulating film and in a same layer where the third gate electrode is provided, the transparent electrode defining a portion of an auxiliary capacitor of the third thin film transistor; wherein
the third gate electrode and the transparent electrode are made of a same material.

2. The thin film transistor substrate of claim 1, wherein the third gate electrode is made of at least one metal oxide selected from the group consisting of indium tin oxide (ITO), indium zinc oxide (IZO), indium tin oxide containing silicon oxide (ITSO), indium oxide ($In_2O_3$), tin oxide ($SnO_2$), and zinc oxide (ZnO).

3. The thin film transistor substrate of claim 1, wherein each of the first semiconductor layer and the second semiconductor layer is an oxide semiconductor layer.

4. The thin film transistor substrate of claim 3, wherein the oxide semiconductor layer is made of at least one metal oxide selected from the group consisting of indium (In), gallium (Ga), aluminium (Al), copper (Cu), and zinc (Zn).

5. The thin film transistor substrate of claim 4, wherein the oxide semiconductor layer is made of indium gallium zinc oxide.

6. The thin film transistor substrate of claim 1, wherein each of the first semiconductor layer and the second semiconductor layer is a silicon-based semiconductor layer.

7. A display device, comprising:
the thin film transistor substrate of claim 1;
a counter substrate opposed to the thin film transistor substrate; and
a display medium layer sandwiched between the thin film transistor substrate and the counter substrate.

8. The display device of claim 7, wherein the display medium layer is a liquid crystal layer.

9. The thin film transistor substrate of claim 1, wherein the first and second thin film transistors have a bottom-gate structure.

10. The thin film transistor substrate of claim 1, wherein the third thin film transistor has a bottom-gate structure.

11. A method for fabricating a thin film transistor substrate including: an insulating substrate; a first thin film transistor including a first gate electrode located on the insulating substrate and a first semiconductor layer located on the first gate electrode and having a first channel region; a second thin film transistor including a second gate electrode located on the insulating substrate and a second semiconductor layer located on the second gate electrode and having a second channel region; an insulating film covering the first semiconductor layer and the second semiconductor layer; a third thin film transistor located on the insulating substrate; and a transparent electrode located on the insulating film and in a same layer where the third gate electrode is provided, the transparent electrode defining a portion of an auxiliary capacitor of the third thin film transistor, the method comprising:
a first and second gate electrode formation step of forming the first gate electrode and the second gate electrode on the insulating substrate;
a semiconductor layer formation step of forming the first semiconductor layer on the first gate electrode and forming the second semiconductor layer on the second gate electrode;
an insulating film formation step of forming the insulating film such that the insulating film covers the first semiconductor layer and the second semiconductor layer; and
a third gate electrode formation step of forming a third gate electrode on the insulating film such that the third gate electrode faces at least one of the first channel region or the second channel region; wherein
the third gate electrode and the transparent electrode are made of a same material in the third gate electrode formation step.

12. The method of claim 11, wherein each of the first semiconductor layer and the second semiconductor layer is an oxide semiconductor layer.

13. The method of claim 11, wherein the oxide semiconductor layer is made of at least one metal oxide selected from the group consisting of indium (In), gallium (Ga), aluminium (Al), copper (Cu), and zinc (Zn).

14. The method of claim 13, wherein the oxide semiconductor layer is made of indium gallium zinc oxide.

* * * * *